United States Patent [19]

Coello-Vera

[11] Patent Number: 4,586,968

[45] Date of Patent: May 6, 1986

[54] PROCESS OF MANUFACTURING A HIGH FREQUENCY BIPOLAR TRANSISTOR UTILIZING DOPED SILICIDE WITH SELF-ALIGNED MASKING

[75] Inventor: Augustin Coello-Vera, Charentilly la Membrolle, France

[73] Assignee: Le Silicium Semiconducteur SSC, Paris, France

[21] Appl. No.: 628,408

[22] Filed: Jul. 6, 1984

[30] Foreign Application Priority Data

Jul. 13, 1983 [FR] France .................... 83 11737

[51] Int. Cl.$^4$ .................... H01L 21/225; H01L 21/283
[52] U.S. Cl. ........................ 148/188; 29/578; 29/590; 29/591; 148/187; 148/190; 148/DIG. 19; 148/DIG. 20; 148/DIG. 106; 148/DIG. 151; 156/653; 156/657; 357/34; 357/35; 357/71; 427/85; 427/88
[58] Field of Search .................... 29/578, 590, 591; 148/187, 188, 190; 427/85, 88, 91; 357/34, 35, 71; 156/653, 657

[56] References Cited

U.S. PATENT DOCUMENTS

| | | | |
|---|---|---|---|
| 4,322,882 | 4/1982 | Vora | 148/188 X |
| 4,381,953 | 5/1983 | Ho et al. | 148/187 X |
| 4,418,468 | 12/1983 | Vora et al. | 29/578 X |
| 4,419,810 | 12/1983 | Riseman | 148/188 X |
| 4,424,101 | 1/1984 | Nowicki | 204/192 SP |
| 4,443,930 | 4/1984 | Hwang et al. | 29/591 X |
| 4,450,620 | 5/1984 | Fuls et al. | 148/187 X |
| 4,481,706 | 11/1984 | Roche | 29/578 X |
| 4,485,552 | 12/1984 | Magdo et al. | 29/578 X |
| 4,495,512 | 1/1985 | Isaac et al. | 357/71 X |

FOREIGN PATENT DOCUMENTS 0051500 12/1982 European Pat. Off.
0076105 6/1983 European Pat. Off.

OTHER PUBLICATIONS

IBM Technical Disclosure Bulletin, vol. 25, No. 4, pp. 1887-1889, Sep. 1982.
IBM Technical Disclosure Bulletin, vol. 23, No. 5, pp. 1917-1918, Oct. 1980.

*Primary Examiner*—William G. Saba
*Attorney, Agent, or Firm*—Roland Plottel

[57] ABSTRACT

Apart from the base fingers (10), this transistor includes a titanium silicide coating, from which the base diffusions have been formed, and a silicon nitride coating (4). The edges of sandwiches made up of bands (3) and (4) are bordered by a silica bank (7) formed automatically by deposit and anisotropic attack, without additional masking. The emitter fingers (9) are overhung by a polycrystalline silicon layer (8) from which doping of these fingers has been obtained.

The possibility is also obtained, automatically and without masks alignment, of having the emitter and base fingers brought firmly together with minimum protection distances.

4 Claims, 5 Drawing Figures

PROCESS OF MANUFACTURING A HIGH FREQUENCY BIPOLAR TRANSISTOR UTILIZING DOPED SILICIDE WITH SELF-ALIGNED MASKING

BACKGROUND OF THE INVENTION (1.) Field of the Invention

The present invention concerns a high frequency bipolar transistor, i.e. one intended for use at frequencies greater than one hundred megahertz, and a manufacturing process for such a transistor.

(2.) Description of the Prior Art

Generally speaking, bipolar transistors intended for use at high frequency include on one of their main sides a collector contact and, on the other main side, emitter and base zones made up, for instance, of parallel and changing fingers. In order to improve the operational characteristics of such transistors, it is desirable that these fingers also be straight and as close as possible. For a given surface transistor, this enables it to operate at the highest frequency or, as regards a transistor operating at a given frequency, it allows the fundamental power to be increased and noise characteristics to be reduced.

SUMMARY OF THE INVENTION

The present invention foresees a new bipolar structure and manufacturing process for such a transistor enabling the width of emitter and base fingers to be minimized and the distance between an emitter finger and base finger to be reduced to an extremely low value. According to this process, successive mask alignments are avoided so as to define the base and emitter fingers and thus the interval between them; on the other hand, the dimensions and configurations of the emitter and base fingers are determined by using a unique masking which does away with the need for positioning tolerance forecasting as regards alignment of successive masks.

A transistor according to the present invention includes, on the surface of a semi-conductor slice, alternating zones with distinct types of conductivity forming the base fingers and emitter fingers. The base fingers are coated with a sandwich which includes at least one first conductor coating made up of a metallic silicide and a second insulating coating; insulating banks lean against the lateral walls of these sandwiches and expand in such a way as to overlap the limits of the base fingers and emitter fingers; and the emitter fingers are coated with at least one conductor coating jutting out onto the second insulating coating.

A manufacturing process for a transistor according to the present invention consists of: forming, on a silicon substrate of a first conductivity type, a first coating of a metallic silicide doped by a dope of a first conductivity type; laying down a second coating of a first insulating substance; opening the first and second coating in order to leave in place a network of parallel bands; uniformly laying down a third coating of a second insulating substance; anisotropically attacking the third layer so that its flat parts are eliminated but with the banks remaining in place against the edges of the bands constituted by the first and second coatings; and carrying on a doping step, beginning firstly with the openings between the said bands according to a second conductivity type so as to form the emitter zones and secondly, by means of diffusion of the dope contained in the silicide, to form the base and contact zones. The silicide may be a titanium silicide.

BRIEF DESCRIPTION OF THE DRAWINGS

These objectives, characteristics and advantages, as well as others belongings to the present invention, will be expounded upon in the description which follows concerning a special realization mode made in relation with FIGS. 1 to 5 herewith which illustrate the successive stages or steps in the manufacture of a transistor according to the present invention.

It is clear from these various figures that none of the dimensions are represented to scale conforming to use in the representation of semiconductors.

DESCRIPTION OF THE PREFERRED EMBODIMENT

The starting point for manufacturing a transistor according to the present invention is a semiconductor slice, of silicon for instance, consisting of successive doped coatings of type $N^+$ (not represented), type $N^-$ and type P. The coatings $N^-$ and $N^+$ correspond to the collector coating and collector contact tap coating, a collector metallization being deposited on coating $N^+$. Coating 1 of type $N^-$ is formed, for instance, by epitaxy on a substrate of type $N^+$ and coating 2 of type P is formed by diffusion or by ion implantation and redistribution or again by epitaxy.

Figure 1:
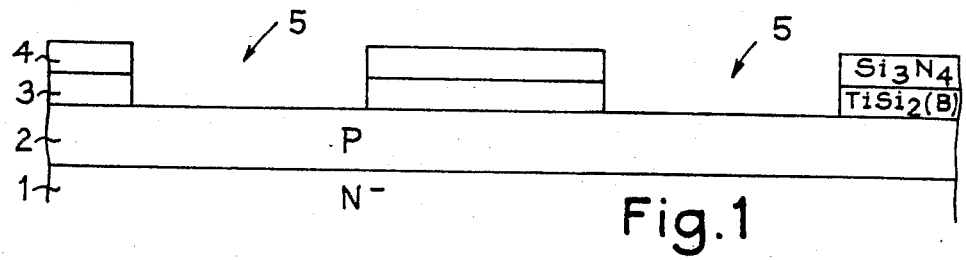

On the surface of type P coating (2), as represented in FIG. 1, a coating of a metallic silicide (3) is deposited followed by a coating of an insulating material (4). The metallic silicide coating (3) is strongly doped with a type P doping product, boron for instance. This can be titanium silicide ($TiSi_2$) or tungsten silicide $WSi_2$. Its thickness is, for instance, of 2.000 to 3.000 Angstroems. It can be formed in various ways, for example by the simultaneous pulverizing of silicon and metal or through evaporation by electron beam. An important characteristic of this coating is its low resistivity.

The insulating layer (4) is, for instance, a silicon nitride coating. It may have a thickness in the region of 2.000 Angstroems.

Following this, the two coatings (3) and (4) of the bands (5) are opened inside the assembly, visibly so in position where it is desired to form the emitter fingers. This opening can take place by means of any recognised process, for example by contact masking under vacuum followed by cutting under plasma.

Figure 2:
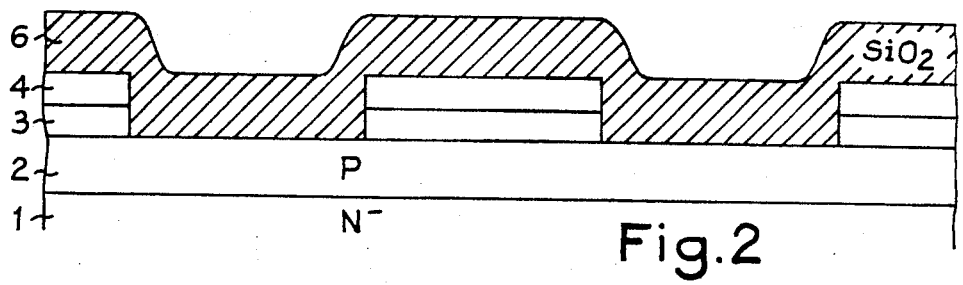

As represented in FIG. 2, a uniform coating of a second insulating substance (6) is then deposited, silicon oxide for example. This deposit can be performed in vapour phase at low pressure and not too high a temperature. The thickness of this coating will be selected according to absolute necessities which will appear hereafter.

Figure 3:
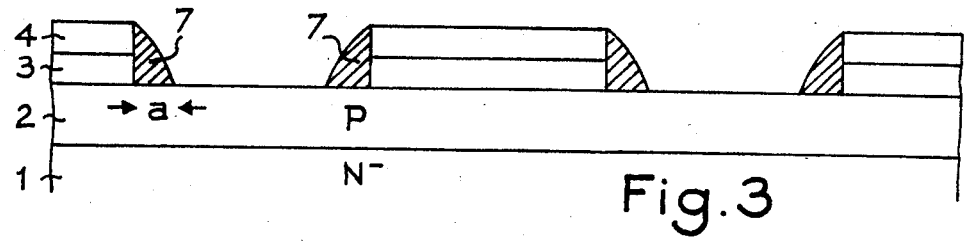

In the step illustrated in FIG. 3, an anisotropic attack is performed on the silica coating (6) by means of a plasma of reactive ions or by an ionic grinding machine. The result of this attack is to completely eliminate the silica coating where it is noticeably level, but to keep the silica banks (7) within the limits of bands formed by the superposition of portions of coatings (3) and (4). The base width a of these bands depends essentially on the thickness of the oxide coating (6). This thickness will therefore be selected, whilst also considering the attack mode, in order to obtain a width a of banks and sufficiently satisfactory to avoid, as will be seen later, any contact between the emitter zones and base contact zones.

Figure 4:
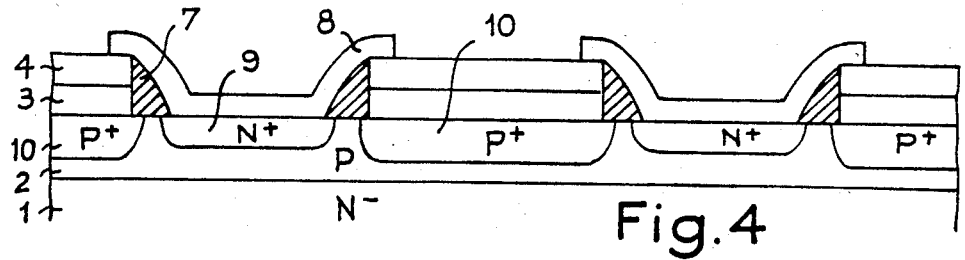

Following this, as represented in FIG. 4, a strongly doped type N polycrystalline silicon coating (8) is deposited on the surface of the slice which is heated in order to diffuse in the substrate firstly, type N dope atoms contained in the polycrystalline silicon coating (8) in such a way as to form emitter fingers and secondly, type P dope atoms, of boron for instance, contained in the metallic silicide coating (3). The width a of the insulating bank (7) is chosen so that the emitter fingers (9) and the base contact fingers (10) do not join up again as a result of this diffusion stage or step.

Figure 5:
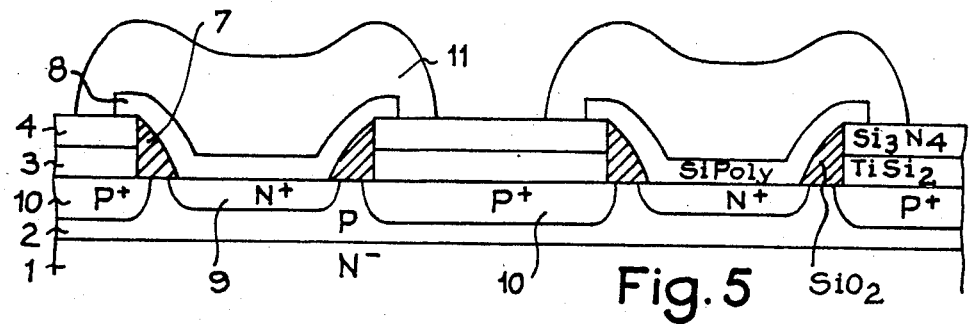

Finally, as shown in FIG. 5, in the general case where each emitter finger must be connected by means of a ballast resistance, a contact tap metallic coating (11) can be deposited on the polycrystalline silicon coating (8). On the other hand, in cases where the ballast resistance is vertical, or even in cases where there is no ballast resistance, the emitter contact tap metallic coating could form a continuum instead of being finger-like as in FIG. 5. The metallic contacts in the base zone (2) are taken up on titanium silicide bands on each side of this zone (2).

In FIGS. 4 and 5, polycrystalline silicon coatings (8) and contact tap coatings (11) are shown cut up into bands in order to visibly conform to the character of the emitter fingers. It will be noted that the maskings which enable these cuts to be made are not subject to critical positionings since coatings (8) and (11) can more or less jut out over the silicon nitride bands (4).

On the other hand, these polycrystalline silicon coatings (8) and contact tap coatings (11) are not necessarily cut up in band form according to emitter finger profiles, but can rest uniformly on the surface of the slice since they are insulated from the grid contact zones (3) and (10) and by the silicon nitride coating (4).

According to a variant of the present invention, emitter fingers can also be realized by a difusion other than a diffusion based on a polycrystalline silicon coating. For instance, a standard gaseous inphase diffusion or implantation can be provided, although the process described and using polycrystalline silicon is today the one preferred.

An important advantage of the process according to the present invention and which has been previously expounded upon results from the fact that a single critical masking stage or step, illustrated in FIG. 1, appears throughout the process and that it is not therefore necessary to provide important protection zones between the emitter fingers and the base fingers. As regards a given cutting technique enabling for instance, at the FIG. 1 step, bands with a width of two microns spaced from a distance of two microns to be provided, one can also obtain an integration density perceptibly two times greater than that obtained by standard processes providing successive mask alignments.

What we claim is:

1. A process for manufacturing a high frequency bipolar transistor having interdigitated base and emitter regions and having conductive layers extending over the interdigitated base and emitter regions to improve conductivity of said regions, said process comprising the following steps:
   forming on a silicon substrate of a first conductivity type a first layer of silicide strongly doped with an impurity of said first conductivity type,
   depositing a second layer of a first insulating substance,
   etching said first and second layers to define narrow parallel openings corresponding to desired locations for emitter regions, said opening being separated by narrow parallel strips of metallic silicide covered by said insulating substance, said strips corresponding to desired locations for base regions interdigitated with said emitter regions,
   uniformly depositing a third layer of a second insulating substance covering said openings and said strips,
   anisotropically etching said third layer so as to remove said insulating substance from horizontal surfaces in said openings and on said strips while leaving ribbons of said second insulating substance on vertical edges of said strips,
   introducing impurities of a second conductivity type opposite to said first type in said openings between said ribbons of insulating substance and heating the substrate to diffuse in the substrate said impurity contained in the metal silicide, so as to form base regions under said strips.

2. A process according to claim 1 wherein after formation of said ribbons of said second insulating substance, a layer of polycrystalline silicon is deposited and etched, said polycrystalline silicon being doped with impurities of said second conductivity type which will subsequently diffuse in the substance in said openings to form emitter regions between said strips.

3. Process according to claim 1, characterized in that the metallic silicide is a titanium silicide.

4. Process according to claim 1, characterized in that the first insulating substance is silicon nitride and the second insulating substance is silica.

* * * * *